(12) United States Patent
Choi et al.

(10) Patent No.: US 10,487,014 B2
(45) Date of Patent: Nov. 26, 2019

(54) EQUIPMENT FOR MANUFACTURING CERAMIC WIRES

(71) Applicant: Sunam Co., LTD., Anseong-si, Gyeonggi-do (KR)

(72) Inventors: KyuHan Choi, Hwaseong-si (KR); Seung Hyun Moon, Seongnam-si (KR); Soon Chul Hwang, Seoul (KR); Hun-Ju Lee, Yongin-si (KR)

(73) Assignee: Sunam Co., Ltd., Gyeonggi-do (KR)

( * ) Notice: Subject to any disclaimer, the term of this patent is extended or adjusted under 35 U.S.C. 154(b) by 625 days.

(21) Appl. No.: 15/035,285

(22) PCT Filed: Sep. 3, 2014

(86) PCT No.: PCT/KR2014/008230
§ 371 (c)(1),
(2) Date: May 9, 2016

(87) PCT Pub. No.: WO2015/068944
PCT Pub. Date: May 14, 2015

(65) Prior Publication Data
US 2016/0289125 A1    Oct. 6, 2016

(30) Foreign Application Priority Data
Nov. 8, 2013 (KR) .................. 10-2013-0135725

(51) Int. Cl.
*C23C 16/44* (2006.01)
*C04B 35/622* (2006.01)
*H01L 39/24* (2006.01)

(52) U.S. Cl.
CPC ........ *C04B 35/62227* (2013.01); *C23C 16/44* (2013.01); *H01L 39/2422* (2013.01); *H01L 39/2432* (2013.01)

(58) Field of Classification Search
None
See application file for complete search history.

(56) References Cited

U.S. PATENT DOCUMENTS 2,382,432 A * 8/1945 McManus ............... C23C 14/56
                                                    118/67
2,384,500 A * 9/1945 Stoll ....................... C23C 14/04
                                                    118/718
(Continued)

FOREIGN PATENT DOCUMENTS

CN    100496194 C    6/2009
CN    102251219 A    11/2011
(Continued)

OTHER PUBLICATIONS

International Search Report PCT/ISA/210 for International Application No. PCT/KR2014/008230 dated Oct. 30, 2014.

*Primary Examiner* — Charles Capozzi
(74) *Attorney, Agent, or Firm* — Harness, Dickey & Pierce, P.L.C.

(57) ABSTRACT

Equipment for manufacturing ceramic wires is disclosed. The manufacturing equipment can comprise a deposition unit for depositing the ceramic wire on a wire substrate, a loading/unloading unit having a release reel for providing the wire substrate to the deposition unit and a coiling reel for discharging the wire substrate from the deposition unit, and at least one buffer unit arranged between the loading/unloading unit and the deposition unit. The buffer unit may continuously be providing the wire substrate to the deposition unit or continuously winding the wire substrate from the deposition unit when the release reel or the coiling reel is replaced.

14 Claims, 6 Drawing Sheets

(56) References Cited

U.S. PATENT DOCUMENTS

| | | | | |
|---|---|---|---|---|
| 2,996,412 | A | * | 8/1961 | Alexander .............. C23C 14/26 |
| | | | | 118/718 |
| 5,157,851 | A | * | 10/1992 | Younan ................. C23C 14/562 |
| | | | | 34/242 |
| 7,462,241 | B2 | | 12/2008 | Sakurada et al. |
| 9,303,316 | B1 | * | 4/2016 | Shufflebotham ...... C23C 14/566 |
| 2006/0087545 | A1 | | 4/2006 | Sakurada et al. |
| 2007/0148329 | A1 | | 6/2007 | Salagaj et al. |
| 2008/0202418 | A1 | * | 8/2008 | Sauer ..................... B65H 19/14 |
| | | | | 118/718 |
| 2010/0252604 | A1 | * | 10/2010 | Lycette ................. B65H 20/00 |
| | | | | 226/195 |
| 2012/0329658 | A1 | | 12/2012 | Moon et al. |

FOREIGN PATENT DOCUMENTS

| | | | |
|---|---|---|---|
| CN | 102884594 | A | 1/2013 |
| JP | 2002-251930 | A | 9/2002 |
| KR | 10-0928221 | B1 | 11/2009 |
| KR | 10-1123830 | B1 | 3/2012 |
| KR | 10-1158747 | B1 | 6/2012 |

* cited by examiner

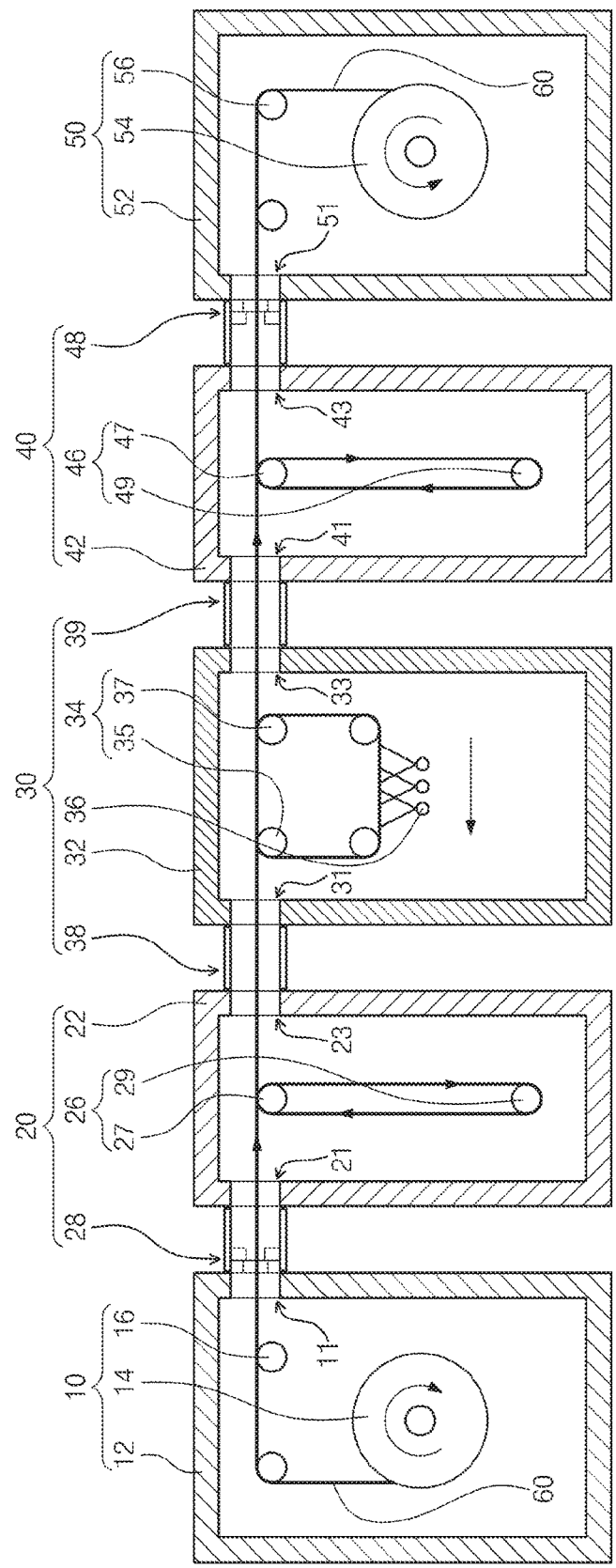

EQUIPMENT FOR MANUFACTURING CERAMIC WIRES

CROSS-REFERENCE TO RELATED APPLICATIONS

This application is the U.S. National Phase application of PCT Application No. PCT/KR2014/008230 filed on Sep. 3, 2014, which claims priority to Korean Patent Application No. 10-2013-0135725 filed on Nov. 8, 2013, the contents of each of which are incorporated herein by reference.

TECHNICAL FIELD

The present inventive concept relates to equipment for manufacturing electric wires, and more particularly, to equipment for manufacturing a ceramic wire including a superconductor thin film.

BACKGROUND ART

A superconductor is a material having a superconducting phenomenon. The superconducting phenomenon represents a phenomenon in which an electric resistance is zero at an extremely low temperature. The superconductor may be classified into a low-temperature superconductor and a high-temperature superconductor according to a critical temperature at which the superconducting phenomenon occurs. Also, the superconductor may be classified into a metal superconductor, an oxide superconductor, and an organic superconductor according to a kind of superconducting materials. The oxide superconductor is generally called a 'high-temperature superconductor' because the oxide superconductor has a critical temperature significantly greater than those of the metal superconductor and the organic conductor. The high-temperature superconductor may be manufactured by using a vacuum deposition apparatus.

DISCLOSURE OF THE INVENTION

Technical Problem

Embodiments of the present inventive concept provide equipment for manufacturing a ceramic wire, which can improve productivity.

Technical Solution

According to exemplary embodiment of the present inventive concept, Equipment for manufacturing a ceramic wire may include: a deposition unit configured to deposit the ceramic wire on a wire substrate; a loading/unloading unit including a release reel configured to provide the wire substrate to the deposition unit and a coiling reel configured to wind the wire substrate from the deposition unit; and at least one buffer unit disposed between the loading/unlading unit and the deposition unit, the at least one buffer unit continuously providing the wire substrate to the deposition unit when the release reel or the coiling reel is replaced or continuously discharging the wire substrate from the deposition unit.

According to an example of the inventive concept, the buffer unit may include: a buffer chamber including a buffer port connected to the loading/unloading unit; a buffer reel-to-reel device disposed within the buffer chamber to adjust a length of the wire substrate within the buffer chamber; and a clamp part coupled to the buffer port to fix the wire substrate when the release reel or the coiling reel is replaced, the clamp part maintaining a vacuum pressure of the buffer chamber.

According to another example of the inventive concept, the buffer reel-to-reel device may include: a plurality of fixed rolls respectively disposed adjacent the loading/unloading unit and the deposition unit to support the wire substrate; and a floating roll disposed between the plurality of fixed rolls to move the wire substrate between the plurality of fixed rolls in upward and downward directions, thereby adjusting a length of the wire substrate within the buffer chamber.

According to an example of the inventive concept, the clamp part may include: a buffer port tube connected between the buffer port and the loading/unloading unit and through which the wire substrate passes; a fixed block disposed on a bottom within the buffer port tube; and a clamp block disposed on the inside of the buffer port tube of the fixed block to fix the wire substrate on the fixed block so as to restrict movement of the wire substrate passing through the buffer port tube when the release reel or the coiling reel is replaced.

According to another example of the inventive concept, the clamp part may further include: a guide block disposed within one side of the buffer port tube adjacent to the clamp block; and a sidewall O-ring disposed between the guide block and the clamp block to block introduction of air into the buffer chamber through the clamp block so as to maintain a vacuum state within the buffer chamber.

According to an example of the inventive concept, the clamp part may further include: a lower O-ring disposed on the fixed block to seal a gap between the fixed block and the wire substrate; and an upper O-ring disposed under the clamp block to seal a gap between the clamp block and the wire substrate.

Equipment for manufacturing a ceramic wire according to an embodiment of the inventive concept may include: a loading unit including a release reel configured to provide a wire substrate; a deposition unit configured to deposit the ceramic wire on the wire substrate provided from the loading unit; a first buffer unit disposed between the deposition unit and the loading unit to continuously provide the wire substrate to the deposition unit from the loading unit when the release reel of the loading unit is replaced; an unloading unit including a coiling reel configured to wind the wire substrate, on which the ceramic wire is deposited, from the deposition unit; and a second buffer unit disposed between the unloading unit and the deposition unit to continuously provide the wire substrate from the deposition unit to the un loading unit when the coiling reel of the unloading unit is replaced.

According to an example of the inventive concept, the first buffer unit may include: a first buffer chamber including a first buffer port connected to the loading unit and a second buffer port connected to the deposition unit; a first buffer reel-to-reel device disposed in the first buffer chamber to adjust a length of the wire substrate within the buffer chamber; and a first clamp part coupled to the first buffer port to fix the wire substrate and maintain a vacuum pressure of the first buffer chamber when the release reel is replaced.

According to another example of the inventive concept, the first buffer reel-to-reel device may include: a plurality of first buffer fixing rolls respectivley disposed adjacent to the first buffer port and the second buffer port to support the wire substrate; and a first floating roll disposed between the first buffer fixing rolls to move the wire substrate between the first buffer fixing rolls, thereby adjusting a length of the wire substrate.

According to an example of the inventive concept, the second buffer unit may include: a second buffer chamber including a third buffer port connected to the deposition unit and a fourth port connected to the unloading unit; a second buffer reel-to-reel device disposed in the second buffer chamber to adjust the length of the wire substrate in the second buffer chamber; and a second clamp part coupled to the fourth buffer port to fix the wire substrate and maintain a vacuum pressure of the second buffer chamber when the coiling reel is replaced.

According to another example of the inventive concept, the second buffer reel-to-reel device may include: a plurality of second buffer fixing rolls respectivley disposed adjacent to the third buffer port and the fourth buffer port to support the wire substrate; and a second floating roll disposed between the second buffer fixing rolls to move the wire substrate between the second buffer fixing rolls, thereby adjusting the length of the wire substrate.

According to an example of the inventive concept, the first and second floating rolls may move in directions opposite to each other when the release reel and the coiling reel are replaced at the same time.

According to another example of the inventive concept, the first floating roll may ascend, and the second floating roll may descend when the release reel and the coiling reel are replaced at the same time.

According to an example of the inventive concept, the first and second buffer reel-to-reel device may respectively include: first and second fixed rolls respectively disposed in the first and second buffer chamber; and first and second movable roll respectively disposed under the first and second fixed roll to adjust a length of the wire substrate while being away from and near to the first fixed roll.

According to another example of the inventive concept, the first clamp part and the second clamp part may respectively include: first and second buffer port tubes connecting the first buffer port to the second buffer port; first and second blocks respectively disposed on inner bottoms of the first and second buffer port tubes; and first and second clamp blocks respectively disposed on the insides of the first and second buffer port tubes to respectively fix the wire substrate within the first and second buffer port tubes to the first and second buffer port tubes when the release reel or the coiling reel is replaced.

According to an example of the inventive concept, the first clamp part and the second clamp part may further include: first and second guide blocks disposed in one sides of the first and second buffer port tubes adjacent to the first and second clamp blocks, respectively; and first and second sidewall O-rings disposed between the first and second guide blocks and the first and second clamp blocks, respectively.

According to another example of the inventive concept, the first clamp part and the second clamp part may further include: first and second lower O-rings disposed on the first and second fixed blocks to seal gaps between the first and second fixed blocks and the wire substrate, respectivley; and first and second upper O-rings disposed under the first and second clamp blocks to seal gaps between the first and second clamp blocks and the wire substrate, respectively.

Advantageous Effects

The equipment for manufacturing the ceramic wire according to the embodiment of the inventive concept may include the first buffer unit and the second buffer unit between the deposition unit and the loading unit or between the deposition unit and the unloading unit. The first buffer unit and the second buffer unit may continuously provide and wind the wire substrate into/from the deposition chamber when the release reel or the coiling reel is replaced. The wire substrate and the superconducting thin film disposed on the wire substrate may be prevented from being contaminated. The equipment for manufacturing the ceramic wire according to the embodiment of the inventive concept may be improved in productivity.

BRIEF DESCRIPTION OF THE DRAWINGS

FIG. 6 is a schematic cross-sectional view of equipment for manufacturing a ceramic wire according to an application example of the inventive concept.

BEST MODE FOR CARRYING OUT THE INVENTION

Figure 1:
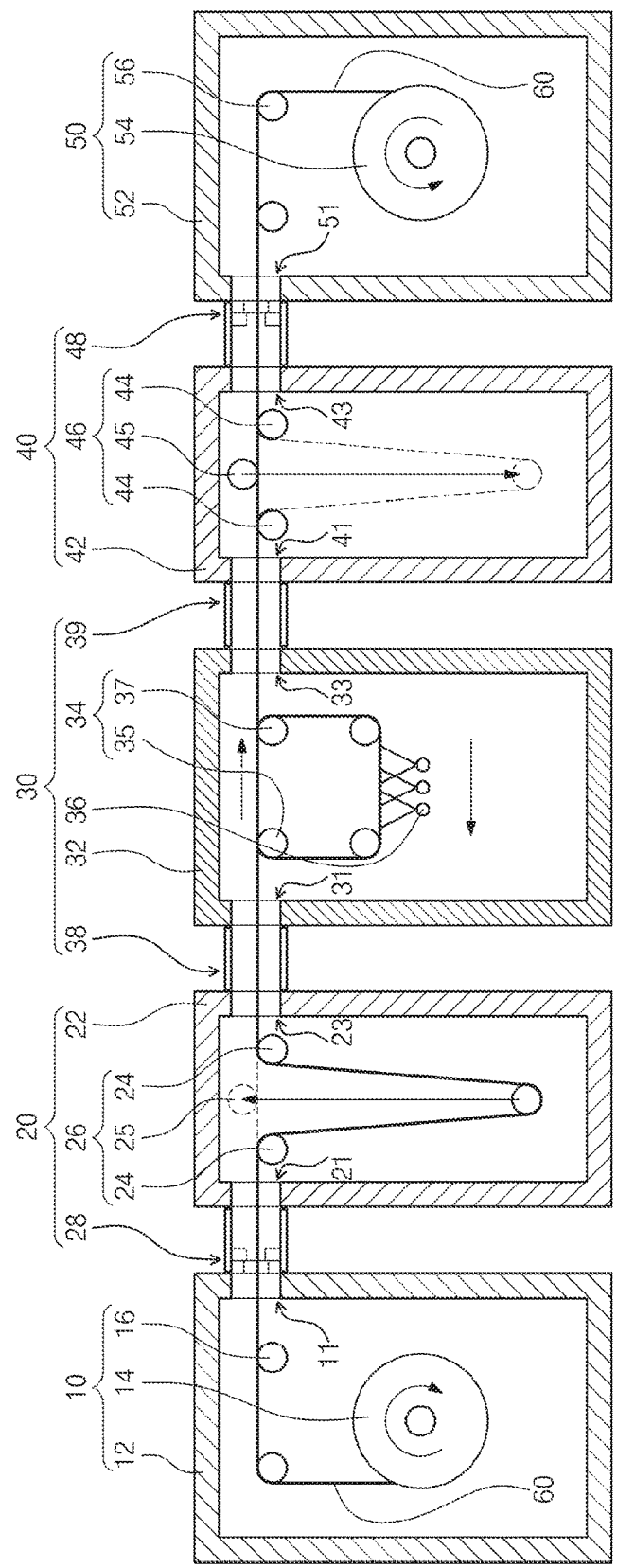
FIG. 1 is a schematic cross-sectional view of equipment for manufacturing a ceramic wire according to an embodiment of the inventive concept.

Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the inventive concept is only defined by scopes of claims. Like reference numerals refer to like elements throughout.

In the following description, the technical terms are used only for explaining a specific exemplary embodiment while not limiting the inventive concept. The terms of a singular form may include plural forms unless specifically mentioned. The meaning of 'comprises' and/or 'comprising' specifies a component, a step, an operation and/or an element does not exclude other components, steps, operations and/or elements.

Additionally, the embodiment in the detailed description will be described with sectional views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may be rounded or have a shape with a predetermine curvature. Areas exemplified in the drawings have general properties, and are used to illustrate a specific shape of a semiconductor package region. Thus, this should not be construed as limited to the scope of the inventive concept.

FIG. 1 is a schematic cross-sectional view of equipment for manufacturing a ceramic wire according to an embodiment of the inventive concept.

Referring to FIG. 1, equipment for manufacturing a ceramic wire according to an embodiment of the inventive concept may include a loading unit 10, a first buffer unit 20, a deposition unit 30, a second buffer unit 40, and an unloading unit 50.

The loading unit 10 may continuously provide a wire substrate 60 to the deposition unit 30 and the unloading unit 50. The loading unit 10 may include a loading chamber 12, a release reel 14, and a plurality of loading fixing rolls 16. The release reel 14 and the loading fixing rolls 16 may be disposed in the loading chamber 12. The loading chamber 12 may have a loading port 11. The loading port 11 may be connected to the first buffer unit 20. The wire substrate 60 may be provided in a state in which the wire substrate 60 is wound around the release reel 14. The wire substrate 60 may be unwound from the release reel 14 in a direction of the loading fixing rolls 16. The loading chamber 12 may be set in a vacuum state. The loading fixing rolls 16 may support the wire substrate 60. The loading fixing rolls 16 may change a moving direction of the wire substrate 60 within the loading chamber 12.

The wire substrate 60 may not indefinitely extend. When the wire substrate 60 is fully unwound from the release reel 14, the release reel 14 and the wire substrate 60 may be replaced with a new release reel 14 and a new wire substrate 60. The wire substrate 60 may include a base material substrate. The base substrate may include a metal having a cubic crystal system such as rolled and heat-treated Ni, a Ni-based alloy (Ni—W, Ni—Cr, Ni—Cr—W, and the like), silver, a silver alloy, and a Ni-silver complex. The wire substrate 60 may further include a buffer layer on the base material substrate. The buffer layer may be a ceramic intermediate layer or formed of MgO, $LaAlO_3$, $LaMnO_3$, $CeO_2$, or $SrTiO_3$. The ceramic intermediate layer may be formed of one of $Al_2O_3$, $Y_2O_3$, $Sc_2O_3$, $Nb_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Ln_2O_3$, and $Pm_2O_3$.

The first buffer unit 20 may be disposed between the loading unit 10 and the deposition unit 30. The first buffer unit 20 may transfer the wire substrate 60 to the deposition unit 30. According to an embodiment of the inventive concept, the first buffer unit 20 may temporarily store the wire substrate 60 in case of emergency. For example, the first buffer unit 20 may provide a vacuum pressure to the deposition unit 30 when the release reel 14 and the wire substrate 60 within the loading chamber 12 are replaced. The loading chamber 12 may be temporarily set in an atmospheric state. A new wire substrate 60 may be bonded to a terminal of the wire substrate 60 within the loading chamber 12. When the release reel 14 and the wire substrate 60 are completely replaced, the loading chamber 12 may be set again to the vacuum state.

Also, the first buffer unit 20 may continuously supply the wire substrate 60 to the deposition unit 30 when the release reel 14 and the wire substrate 60 are replaced. For example, the wire substrate 60 may be temporarily stored. The wire substrate 60 within the first buffer unit 20 may be gradually reduced in length from when the wire substrate 60 is separated from the release reel 14 before a new wire substrate 60 is provided to the release reel 14.

According to an embodiment of the inventive concept, the first buffer unit 20 may include a first buffer chamber 22, a first buffer reel-to-reel device 26, and a first wire clamping part 28.

The first buffer chamber 22 may connect a deposition chamber 32 of the deposition unit 30 to the loading chamber 12. The first buffer chamber 12 may have a first buffer port 21 and a second buffer port 23. The first buffer port 21 may be disposed adjacent to the loading unit 10. The first buffer port 21 and the loading port 11 may be connected to each other by the first wire clamp part 28. The wire substrate 60 may extend from the loading chamber 12 and the deposition chamber 32. The wire substrate 60 may pass through the loading port 11, the first wire clamp part 28, and the first buffer port 21. The second buffer port 23 may be disposed adjacent to the deposition unit 30.

The first buffer reel-to-reel device 26 may adjust a length of the wire substrate 60 within the first buffer chamber 22. The first buffer reel-to-reel device 26 may include a plurality of first buffer fixing rolls 24 and a first floating roll 25.

The first buffer fixing rolls 24 may support the wire substrate 60 to be stored in the first buffer chamber 22. The first buffer fixing rolls 24 may be disposed adjacent to the first buffer port 21 and the second buffer port 23, respectively.

The first floating roll 25 may be disposed between the first buffer fixing rolls 24. The first floating roll 25 may move the wire substrate 60 between the first buffer fixing rolls 24 in a downward direction. The first floating roll 25 may adjust a length of the wire substrate 60 between the first buffer fixing rolls 24. The first floating roll 25 may move up and down. When the first floating roll 25 descends to a lower side of the plurality of first buffer fixing rolls 24, the wire substrate 60 stored in the first buffer chamber 22 may increase in length. For example, before the wire substrate 60 is fully unwound from the release reel 14, the first floating roll 25 may maximally descend a lower side of the first buffer fixing rolls 24. The wire substrate within the first buffer chamber 22 may have a maximum length. When the wire substrate 60 is fully unwound from the release reel 14, a new release reel 14 and a new wire substrate 60 may be replaced within the load chamber 12. Till then, the first floating roll 25 may gradually ascend.

The first floating roll 25 may gradually ascend to approach the plurality of first buffer fixing rolls 24. The wire substrate 60 within the first buffer chamber 22 may be reduced in length. When the wire substrate 60 is completely replaced, and then the loading chamber is set in the vacuum state, the first floating roll 25 may descend again.

When the release reel 14 is replaced, the first wire clamp part 28 may fix the wire substrate 60 at a front end of the first buffer chamber 22. The first wire clamp part 28 may be disposed between the loading port 11 and the first buffer port 21. Also, when the loading chamber is in the atmospheric state, the first wire clamp part 28 may continuously maintain the vacuum state of the first buffer chamber 22.

MODE FOR CARRYING OUT THE INVENTION

Figure 2:
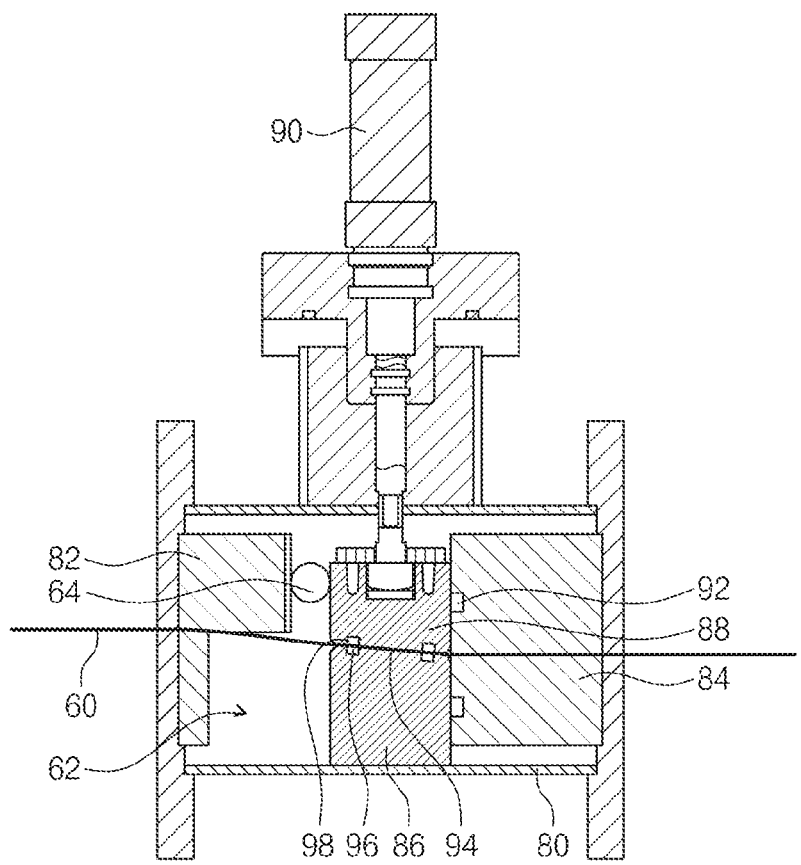
FIG. 2 is a cross-sectional view of a first wire clamp part of FIG. 1.
Figure 3:
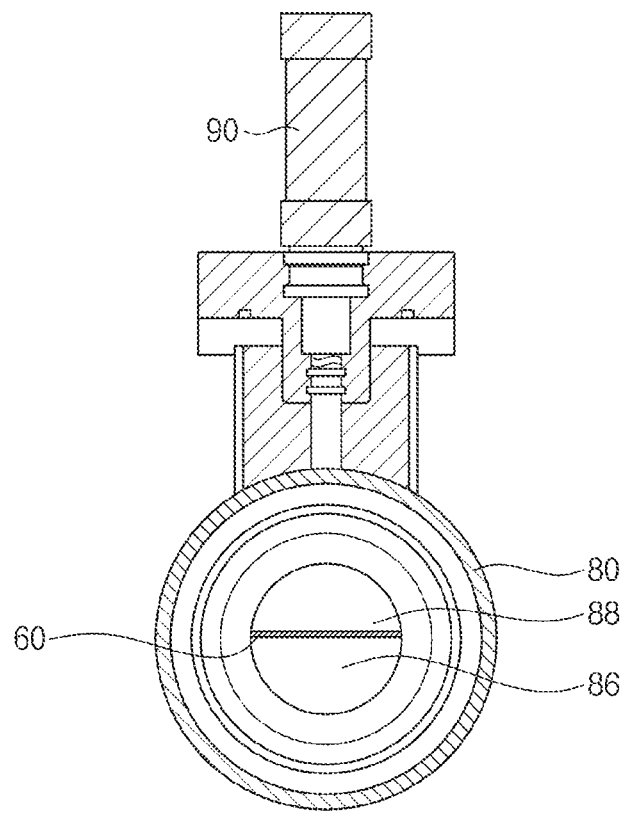
FIG. 3 is a side view of FIG. 3.

FIG. 2 is a cross-sectional view of the first wire clamp part 28 of FIG. 1. FIG. 3 is a side view of FIG. 3.

Referring to FIGS. 1 to 3, the first wire clamp part 28 may include a first buffer port tube 80, a first guide block 82, a second guide block 84, a first fixed block 86, a second clamp block 88, a first bearing 62, a first air cylinder 90, a first sidewall O-ring 92, a first lower O-ring 96, and a first upper O-ring 98.

The first buffer port tube 80 may be disposed between the first buffer port 21 of the first buffer chamber 22 and the loading port 11 of the loading chamber 12.

The first guide block 82 may be disposed within one side of the first buffer port tube 80. The first guide block 82 may be disposed adjacent to the loading chamber 12. The wire substrate 60 may pass through the first guide block 82 to move. The first guide block 82 may seal the inside of one side of the buffer port tube 80 except for a portion through which the wire substrate 60 passes.

The second guide block 84 may be disposed within the other side of the first buffer port tube 80. The second guide block 84 may be disposed adjacent to the first buffer chamber 22. The wire substrate 60 may pass through the second guide block 84 to move. The second guide block 84 may seal the inside of the other side of the first buffer port tube 80 except for the portion through which the wire substrate 60 passes.

The first fixed block 86 may be fixed to an inner bottom of the first buffer port tube 80 between the first guide block 82 and the second guide block 84. A sidewall of the first fixed block 86 may be fixed to the second guide block 84. According to an embodiment of the inventive concept, the first fixed block 86 may seal a lower portion of the second guide block 84 within the first buffer port tube 80.

The first clamp block 88 may be disposed on the first fixed block 86. The first clamp block 88 may move along the second guide block 84. The first clamp block 88 and the second guide block 84 may be sealed by the first sidewall O-ring 92.

The first bearing 64 may be disposed between the first clamp block 88 and the first guide block 82. The first bearing 64 may smoothly move in a vertical direction of the first clamp block 88.

The first sidewall O-ring 92 may be disposed between the first clamp block 88 and the second guide block 84 and between the first fixed block 86 and the second guide block 84.

The first sidewall O-ring 92 may be disposed between the first guide block 82 and the first clamp block 88. The first sidewall O-ring 92 may block a flow of air between the first guide block 82 and the first clamp block 88.

The wire substrate 60 may be disposed between the first clamp block 88 and the first guide block 82. The first clamp block 88 may be separated from the wire substrate 60 or may contact the wire substrate 60. The wire substrate 60 may be fixed by the first clamp block 88 and the first fixed block 86.

The first lower O-ring 96 may be disposed a top surface of the first fixed block 86. The first upper O-ring 98 may be disposed on a bottom surface of the first clamp block 88. When the first clamp block 88 and the first fixed block 86 fix the wire substrate 60, the first lower O-ring 96 and the first upper O-ring 98 may seal a gap between the first clamp block 88 and the first fixed block 86.

The first clamp block 88 and the first fixed block 86 may have first inclined surfaces 94 that are inclined with respect to the moving direction of the wire substrate 60. The first inclined surfaces 94 may efficiently fix the wire substrate 60. Also, when the first clamp block 88 and the first fixed block 86 fix the wire substrate 60, the inside of the first buffer port tube 80 may be sealed to maintain the vacuum state of the first buffer chamber 22.

The wire substrate 60 may be rounded by the first inclined surfaces 94. The first guide block 82 may have a first cavity 62 through which the rounded wire substrate 60 passes. The first cavity 62 may be defined under the first guide block 82. When the first clamp block 88 and the first fixed block 86 fix the wire substrate 60, the wire substrate 60 may be rounded within the first cavity 62 in a downward direction.

The first air cylinder 90 may be disposed on the first clamp block 88. The first air cylinder 90 may move the first clamp block 88 in upward and downward directions.

The deposition unit may continuously perform a formation process of a superconducting ceramic wire (now shown) of the wire substrate 60 while being maintained in the vacuum state. The ceramic wire may include a superconductor layer. When the wire substrate 60 within the deposition unit 30 is exposed to air, defects in deposition process may occur. Also, a ceramic thin film on the wire substrate 60 may be contaminated. As described above, the first wire clamp part 28 may allow the wire substrate 60 to be replaced with a new wire substrate 60 while maintaining the first buffer chamber 22 and the deposition unit 30 to the vacuum state to prevent the deposition unit from being exposed to the air. Thus, the wire substrate 60 within the deposition unit 30 may be prevented from being contaminated.

Thus, the equipment for manufacturing the ceramic wire according to the first embodiment of the inventive concept may be improved in productivity.

The deposition unit 30 may include a deposition chamber 32, a deposition reel-to-reel device 34, a deposition member 36, a first deposition port tube 38, and a second deposition port tube 39.

The deposition chamber may have a first deposition port 31 and a second deposition port 33. The first deposition port 31 may be disposed adjacent to the first buffer unit 20. The first deposition port tube 38 may be coupled to the first deposition port 31. The first deposition port tube 38 may connect the first deposition port 31 to the second buffer port 23. The wire substrate 60 may pass through the second buffer port 23, the first deposition port tube 38, and the first deposition port 31. The deposition chamber 32 and the buffer chamber 22 are provided in a state in which the deposition chamber 32 and the buffer chamber 22 are separated from each other. However, the inventive concept is not limited thereto, and thus, the embodiment of the inventive concept may be variously modified. When the deposition chamber 32 and the buffer chamber 22 are under the same environment, the deposition chamber 32 and the buffer chamber 22 may be provided as one unit.

The second deposition port 33 may be disposed adjacent to the second buffer unit 40. The second deposition port tube 39 may be coupled to the second deposition port 33. The second deposition port tube 39 may connect a third buffer port 41 of the second buffer unit 40 to the second deposition port 33.

Figure 4:
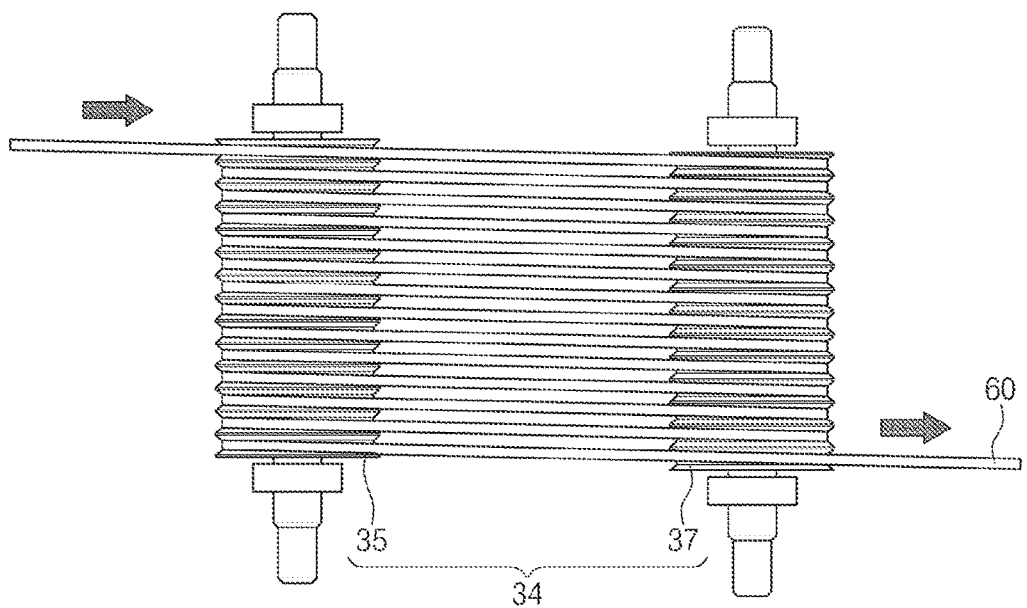
FIG. 4 is a plan view of a deposition reel-to-real device.

FIG. 4 is a plan view of the deposition reel-to-real device 34.

Referring to FIGS. 1 and 4, the deposition reel-to-reel device 34 may be disposed in the deposition chamber 32. The deposition reel-to-reel device 34 includes a first reel member 35 and a second reel member 37, and the first reel member 35 and the second reel member 37 are spaced to face each other. The first reel member 35 and the second reel member 37 may wind the wire substrate 60 on an area on which the ceramic wire is deposited. That is, the wire substrate 60 comes and goes between the first reel member 35 and the second reel member 37 and then is turned around the first reel member 35 and the second reel member 37. The first reel member 35 and the second reel member 37 may have the same constituent.

The first reel member 35 includes reels that are disposed and coupled in an extension direction of the second reel member 37. The first reel member 35 may include a first upper reel and a first lower reel. The second reel member 37 may include a second upper reel and a second lower reel.

Thus, the deposition reel-to-reel device 34 may include four reels. However, the inventive concept is not limited thereto, and thus embodiments of the inventive concept may be variously modified. For example, the deposition reel-to-reel device 34 may include two reels.

The wire substrate 60 is turned at once per each reel. Both ends of each of the reels may protrude outward, and a width between areas of the reel contacting the wire substrate 60 may be the same as that of the wire substrate 60 or greater by about 10% than that of the wire substrate 60. The reels may be independently driven and rotated by friction force with the wire substrate 60. A surface of the reel contacting the wire substrate 60 may be formed of a material having strength and rigidity greater than or equal to those of the wire substrate 60.

The second reel member 37 is disposed to be dislocated with the first reel member 35 to allow the wire substrate 60 to be multi-turned. The wire substrate 60 moves in an extension direction of the first reel member 35 and the second reel member 37 while coming and going between the first reel member 35 and the second reel member 37.

Referring again to FIG. 1, the deposition member 36 is disposed under the deposition reel-to-reel device 34. The deposition member 36 is disposed under the wire substrate 60 that is disposed between the first reel member 35 and the second reel member 37 to provide steam of a superconducting material to the surface of the wire substrate 60.

According to an embodiment of inventive concept, the deposition member 36 may form material on the wire substrate 60 by using an E-beam evaporation method. The deposition member 36 may include a bean generation part for irradiating E-beam onto first to third sources that are disposed under the wire substrate 60. Each of the beam generation parts may include a boat. The first to third sources may include a source for a rare-earth material, a source for barium, and a source for copper, respectively. The source for the rear-earth material may be understood as yttrium and lanthanum group elements or a combination thereof. The lanthanum group element may include La, Nd, Sm, Eu, Gd, Tb, Dy, Ho, Er, Tm, Yb, and Lu, as well known. The wire substrate 60 may be exposed to an oxygen atmosphere. The first to third sources may react with oxygen to form the ceramic wire on the wire substrate 60. Thus, the ceramic wire may include a complex metal oxide.

The second buffer unit 40 may be disposed between the deposition unit 30 and the unloading unit 50. When the unloading chamber 52 is exposed to the atmospheric pressure, the second buffer unit 40 may maintain the vacuum state of the deposition chamber 32.

The second buffer unit 40 may include a second buffer chamber 42, a second buffer reel-to-reel device 46, and a second wire clamp part 48.

The second buffer chamber 42 may have a third buffer port 41 and a fourth buffer port 43. The third buffer port 41 may be disposed adjacent to the deposition unit 30. The fourth buffer port 43 may be disposed adjacent to the unloading unit 50. The fourth buffer port 43 may be connected to the second wire clamp part 48. The wire substrate 60 may pass through the first deposition port tube 38, the deposition chamber 32, and the second deposition port tube 39 to move.

The second buffer reel-to-reel device 46 may be disposed in the second buffer chamber 42. The second buffer reel-to-reel device 46 may adjust a length of the wire substrate 60 within the second buffer chamber 42. The second buffer reel-to-reel device 46 may include second buffer fixing rolls and second floating rolls 45.

The second buffer fixing rolls 44 may support the wire substrate 60 within the second buffer chamber 42. The second buffer fixing rolls 44 may be disposed adjacent to the third buffer port 41 and the fourth buffer port 43, respectively.

The second floating rolls 45 may be disposed between the second buffer fixing rolls 44. The second floating rolls 45 may adjust a length of the wire substrate 60 between the second buffer fixing rolls 44. Each of the second floating rolls 45 may ascend and descend. The second floating roll 45 may increase a length of the wire substrate 60 within the second buffer chamber 42 when the coiling reel 54 of the unloading unit 50 is replaced. The second floating roll 45 may descend. When the coiling reel 54 of the unloading unit 50 is completely replaced, the wire substrate 60 within the second buffer chamber 42 may decrease again in length. The second floating roll 45 may ascend.

The first floating roll 25 and the second floating roll 45 may be interlocked with each other to operate. According to an embodiment of the inventive concept, the second floating roll 45 may ascend and descend in a direction opposite to the first floating roll 25. For example, when the release reel 14 of the loading unit 10 is replaced, the first floating roll 25 may ascend. When the replacement of the release reel 14 is completed, the first floating roll 25 may descend. When the coiling reel 54 of the unloading unit 50 is replaced, the second floating roll 45 may descend. When the replacement of the coiling reel 54 is completed, the second floating roll 45 may ascend.

For example, when the release reel 14 and the coiling reel 54 are replaced at the same time, the first floating roll 25 may ascend from a bottom pint, and the second floating roll 45 may descend from a top point. When the release reel 14 and the coiling reel 54 are completely replaced at the same time, the second floating roll 45 may ascend. In general, the first floating roll 25 may be disposed to be maximally spaced apart from the first buffer fixing rolls 24, and the second floating roll 45 may be disposed at the same level as the second buffer fixing rolls 44.

When the coiling reel 54 is replaced, the second wire clamp part 48 may maintain the vacuum state of the second buffer chamber 42 and fix the wire substrate 60.

Figure 5:
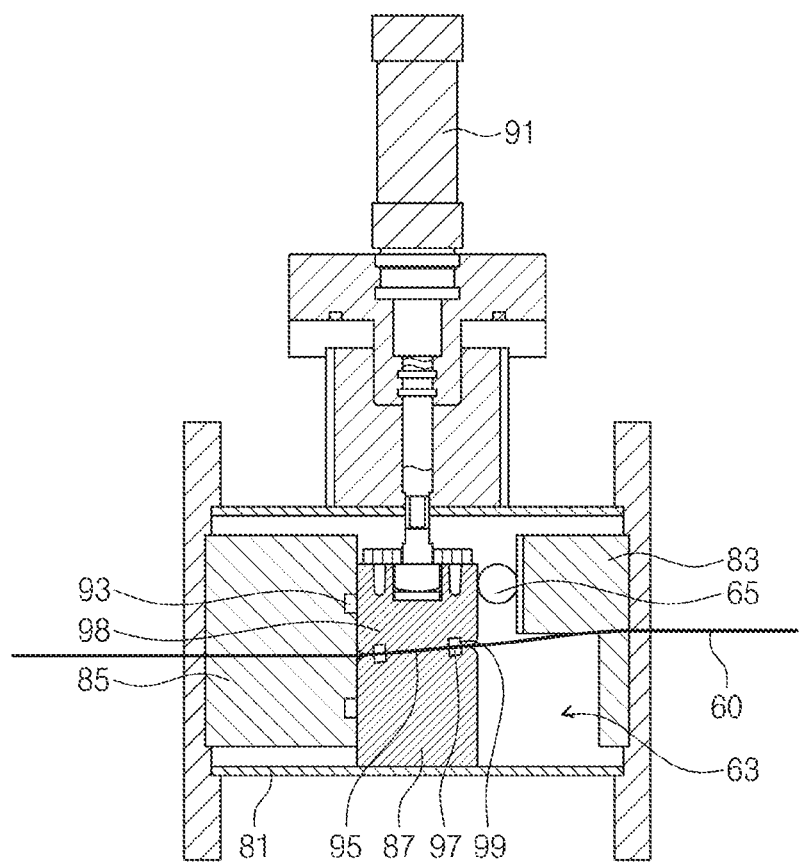
FIG. 5 is a cross-sectional view of a second wire clamp part of FIG. 1.

FIG. 5 is a side cross-sectional view of the second wire clamp part 48 of FIG. 1.

Referring to FIGS. 1 and 5, the second wire clamp part 48 may include a second buffer port tube 81, a third guide block 83, a fourth guide block 85, a second fixed block 87, a second clamp block 89, a second bearing 65, a second air cylinder 91, a second sidewall O-ring 93, a second lower O-ring 97, and a second upper O-ring 99.

The first buffer port tube 80 may be disposed between the third buffer port 41 of the second buffer chamber 42 and the unloading port 51 of the unloading chamber 52.

The wire substrate 60 may move to the unloading chamber 52 through the fourth buffer port 43, the second wire clamp part 48, and the unloading port 51.

The third guide block 83 may be disposed within one side of the second buffer port tube 81. The third guide block 83 may be disposed adjacent to the second buffer chamber 42. The wire substrate 60 may pass through the third guide block 83 to move. The third guide block 83 may seal one side of the second buffer port tube 81 except for the portion through which the wire substrate 60 passes.

The fourth guide block 85 may be disposed within the other side of the second buffer port tube 81. The fourth guide block 85 may be disposed adjacent to the unloading chamber 52. The wire substrate 60 may pass through the fourth guide block 85 to move. The fourth guide block 85 may seal the other side of the second buffer port tube 81 except for the portion through which the wire substrate 60 passes.

The second fixed block 87 may be fixed to an inner bottom of the second buffer port tube 81 between the third guide block 83 and the fourth guide block 85. A sidewall of the second fixed block 87 may be fixed to the third guide block 83. The second fixed block 87 may seal a lower portion of the third guide block 83.

The second clamp block 89 may be disposed on the second fixed block 87. The second clamp block 89 may move along the third guide block 83. The second clamp block 89 and the third guide block 83 may be sealed by the second sidewall O-ring 93.

The second bearing 65 may be disposed between the fourth guide block 85 and the second clamp block 89. The second bearing 65 may help vertical movement of the second clamp block 89.

The second sidewall O-ring 93 may be disposed between the second clamp block 89 and the third guide block 83 and between the second fixed block 87 and the third guide block 83.

The wire substrate 60 may be disposed between the second clamp block 89 and the second fixed block 87. The second clamp block 89 may be separated from the wire substrate 60 or may contact the wire substrate 60. The wire substrate 60 may be fixed when the second clamp block 89 and the second fixed block 87 are clamped.

The second lower O-ring 97 may be disposed a top surface of the second fixed block 87. The second upper O-ring 99 may be disposed on a bottom surface of the second clamp block 89. When the second clamp block 89 and the second fixed block 87 fix the wire substrate 60, the second lower O-ring 97 and the second upper O-ring 99 may seal a gap between the second clamp block 89 and the second fixed block 87.

The second clamp block 89 and the second fixed block may have second inclined surfaces 95 that are inclined with respect to the moving direction of the wire substrate 60. The second inclined surfaces 95 may efficiently fix the wire substrate 60. Also, when the first clamp block 88 and the first fixed block 86 fix the wire substrate 60, the inside of the first buffer port tube 80 may be sealed to maintain the vacuum state of the first buffer chamber 22.

The wire substrate 60 may be rounded by the second inclined surfaces 95. The fourth guide block 85 may have a second cavity 63 through which the rounded wire substrate 60 passes. The second cavity 63 may be defined under the fourth guide block 85. When the second clamp block 89 and the second fixed block 87 fix the wire substrate 60, the wire substrate 60 may be rounded within the second cavity 63 in a downward direction.

The second air cylinder 91 may be connected to the second clamp block 89. The second air cylinder 91 may move the second clamp block 89 in upward and downward directions.

The unloading unit 50 may continuously unload the wire substrate 60. According to an embodiment of the inventive concept, the unloading unit 50 may include an unloading chamber 52, a coiling reel 54, and unloading fixing rolls 56.

The unloading chamber may be set in a vacuum state. The unloading chamber 92 may have an unloading port 51. The unloading port 51 may be connected to the second wire clamp part 48.

The coiling reel 54 and the unloading fixing rolls 56 may be disposed in the unloading chamber 92. The coiling reel 54 may wind the wire substrate 60 on which the ceramic wire is disposed.

The unloading fixing rolls 56 may support the wire substrate 60. The moving direction of the wire substrate 60 may be changed by the unloading fixing rolls 56.

The wire substrate 60 may not be indefinitely wound around the coiling reel 54. The coiling reel 54 may be replaced after the wire substrate 60 is wound by a predetermined length. The unloading chamber 52 may be set in the atmospheric state.

As described above, the second buffer unit 40 may maintain the vacuum state of the deposition unit 30 when the coiling reel 54 is replaced in the unloading chamber 52 and continuously provide the wire substrate 60.

FIG. 6 is a schematic cross-sectional view of equipment for manufacturing a ceramic wire according to an embodiment of the inventive concept.

Referring to FIG. 6, equipment for manufacturing a ceramic wire according to an embodiment of the inventive concept may include first and second fixed rolls 27 and 47 and first and second buffer reel-to-reel devices 26 and 46 that respectively include first and second movable rolls 29 and 49.

The first and second fixed rolls 27 and 47 may be fixed at the same level as first to fourth buffer ports 21, 23, 41, and 43. The first and second fixed rolls 27 and 47 may change a moving direction of a wire substrate 60. However, the inventive concept is not limited thereto, and thus an embodiment of the inventive concept may be variously modified.

The first and second movable rolls 29 and 49 may be disposed under the first and second fixed rolls 27 and 47. The first and second movable rolls 29 and 49 may be away from or near to the first and second fixed rolls 27 and 47. The first and second movable rolls 29 and 49 may adjust a length of the wire substrate 60 within the first and second buffer chambers 22 and 42. The first and second movable rolls 29 and 49 may correspond to the first and second floating rolls 25 and 45 according to the foregoing embodiment. However, the inventive concept is not limited thereto, and thus an embodiment of the inventive concept may be variously modified. For example, the first fixed roll 27 and the first movable roll 29 may be horizontally disposed to fluidically move with respect to each other. The second fixed roll 47 and the second movable roll 49 may be horizontally disposed to fluidically move with respect to each other.

According to an embodiment of the inventive concept, the plurality of first and second buffer fixing rolls 24 and 44 are substituted with the first and second fixed rolls 27 and 47, respectively.

Although the embodiment of the inventive concept is described with reference to the accompanying drawings, those with ordinary skill in the technical field of the inventive concept pertains will be understood that the inventive concept can be carried out in other specific forms without changing the technical idea or essential features. Thus, the above-disclosed embodiments are to be considered illustrative and not restrictive.

INDUSTRIAL APPLICABILITY

The equipment for manufacturing the ceramic wire according to the embodiment of the inventive concept may prevent the superconducting thin film on the ceramic wire from being contaminated when the reel, around which the ceramic wire is wound is replaced, to improve the productivity.

The invention claimed is:

1. Equipment for manufacturing a ceramic wire, comprising:
   a deposition unit including a deposition member configured to vacuum deposit metallic material on a wire substrate, the metallic material configured to be oxidized;
   a loading/unloading unit comprising a release reel configured to provide the wire substrate to the deposition unit and a coiling reel configured to wind the wire substrate from the deposition unit; and
   at least one buffer unit between the loading/unloading unit and the deposition unit, the at least one buffer unit continuously providing the wire substrate to the deposition unit when the release reel or the coiling reel is replaced or continuously discharging the wire substrate from the deposition unit, the at least one buffer unit including
      a buffer chamber including a buffer port connected to the loading/unloading unit, and
      a clamp part coupled to the buffer port, the clamp part including
         a fixed block,
         a clamp block, the fixed block together with the clamp block configured to restrict movement of the wire substrate and maintain a vacuum pressure, and
      the clamp part further including,
         a buffer port tube connected between the buffer port and the loading/unloading unit and through which the wire substrate passes;
      wherein the fixed block is on a bottom of the buffer port tube, and
      the clamp block is above the fixed block, the clamp block together with the fixed block configured to fix the wire substrate on the fixed block so as to restrict movement of the wire substrate passing through the buffer port tube when the release reel or the coiling reel is replaced.

2. The equipment of claim 1, wherein the at least one buffer unit comprises:
   a buffer reel-to-reel device disposed within the buffer chamber to adjust a length of the wire substrate within the buffer chamber.

3. The equipment of claim 2, wherein the buffer reel-to-reel device comprises:
   a plurality of fixed rolls respectively disposed adjacent the loading/unloading unit and the deposition unit to support the wire substrate; and
   a floating roll disposed between the plurality of fixed rolls to move the wire substrate between the plurality of fixed rolls in upward and downward directions, thereby adjusting a length of the wire substrate within the buffer chamber.

4. The equipment of claim 2, wherein the buffer reel-to-reel device comprises:
   a fixed roll fixed within the buffer chamber; and
   a movable roll disposed under the fixed roll to adjust a length of the wire substrate while being away from and near to the fixed roll.

5. The equipment of claim 1, wherein each of the fixed block and the clamp block has an inclined surface that is inclined with respect to a moving direction of the wire substrate.

6. The equipment of claim 1, wherein the clamp part further comprises:
   a guide block on one side of the buffer port tube adjacent to the clamp block; and
   a sidewall O-ring between the guide block and the clamp block, the sidewall O-ring configured to block introduction of air into the buffer chamber through the clamp block so as to maintain a vacuum state within the buffer chamber.

7. The equipment of claim 1, wherein the clamp part further comprises:
   a lower O-ring on the fixed block to seal a gap between the fixed block and the wire substrate; and
   an upper O-ring under the clamp block to seal a gap between the clamp block and the wire substrate.

8. Equipment for manufacturing a ceramic wire, comprising:
   a loading unit comprising a release reel configured to provide a wire substrate;
   a deposition unit including a deposition member configured to vacuum deposit metallic material on the wire substrate provided from the loading unit, the metallic material configured to be oxidized;
   a first buffer unit between the deposition unit and the loading unit to continuously provide the wire substrate from the loading unit to the deposition unit when the release reel of the loading unit is replaced, the first buffer unit including
      a first buffer chamber comprising a first buffer port connected to the loading unit and a second buffer port connected to the deposition unit, and
      a first clamp part coupled to the first buffer port;
   an unloading unit comprising a coiling reel configured to wind the wire substrate, on which the ceramic wire is deposited, from the deposition unit; and
   a second buffer unit between the unloading unit and the deposition unit to continuously provide the wire substrate from the deposition unit to the unloading unit when the coiling reel of the unloading unit is replaced,
   wherein the first clamp part includes
      a first block,
      a first clamp block, the first block together with the first clamp block, configured to restrict movement of the wire substrate and maintain a vacuum pressure,
   wherein the first buffer unit further includes,
      a first buffer reel-to-reel device disposed in the first buffer chamber to adjust a length of the wire substrate within the buffer chamber,
   wherein the first buffer reel-to-reel device includes
      a plurality of first buffer fixing rolls respectively disposed adjacent to the first buffer port and the second buffer port to support the wire substrate; and
      a first floating roll disposed between the first buffer fixing rolls to move the wire substrate between the first buffer fixing rolls, thereby adjusting a length of the wire substrate,
   wherein the second buffer unit further includes
      a second buffer chamber comprising a third buffer port connected to the deposition unit and a fourth buffer port connected to the unloading unit;
      a second buffer reel-to-reel device disposed in the second buffer chamber to adjust a length of the wire substrate in the second buffer chamber; and
      a second clamp part coupled to the fourth buffer port to fix the wire substrate and maintain a vacuum pressure of the second buffer chamber when the coiling reel is replaced, and wherein and the second clamp part includes
- a second block on an inner bottom of the fourth buffer port; and
- a second clamp block on the inside of the fourth buffer port, the second block together with the second clamp block configured to fix the wire substrate within the fourth buffer port and maintain a vacuum pressure.

9. The equipment of claim 8, wherein the second buffer reel-to-reel device comprises:
- a plurality of second buffer fixing rolls respectively disposed adjacent to the third buffer port and the fourth buffer port to support the wire substrate; and
- a second floating roll disposed between the second buffer fixing rolls to move the wire substrate between the second buffer fixing rolls, thereby adjusting the length of the wire substrate.

10. The equipment of claim 9, wherein the first and second floating rolls move in directions opposite to each other when the release reel and the coiling reel are replaced at the same time.

11. The equipment of claim 9, wherein the first floating roll ascends, and the second floating roll descends when the release reel and the coiling reel are replaced at the same time.

12. The equipment of claim 8, wherein the first and second blocks and the first and second clamp blocks have inclined surfaces that are inclined with respect to a moving direction of the wire substrate.

13. The equipment of claim 8, wherein the second clamp part further comprises:
- a third guide block on one side of the fourth buffer port adjacent to the second clamp block, respectively; and
- sidewall O-rings between the third guide block and the second clamp block, respectively.

14. The equipment of claim 8, wherein
the first clamp part further includes
- a first lower O-ring on the first block to seal gaps between the first block and the wire substrate; and
- a first upper O-ring under the first clamp block to seal gaps between the first clamp block and the wire substrate, and the second clamp part further includes
- a second lower O-ring on the second block to seal gaps between the second block and the wire substrate; and
- a second upper O-ring under the second clamp block to seal gaps between the second clamp block and the wire substrate.

* * * * *